US011936353B2

(12) United States Patent
Groen et al.

(10) Patent No.: US 11,936,353 B2
(45) Date of Patent: Mar. 19, 2024

(54) DIRECT-SWITCHING H-BRIDGE CURRENT-MODE DRIVERS

(71) Applicant: Cadence Design Systems, Inc., San Jose, CA (US)

(72) Inventors: Eric Douglas Groen, Ankeny, IA (US); Charles Walter Boecker, Ames, IA (US)

(73) Assignee: Cadence Design Systems, Inc., San Jose, CA (US)

( * ) Notice: Subject to any disclaimer, the term of this patent is extended or adjusted under 35 U.S.C. 154(b) by 437 days.

(21) Appl. No.: 17/270,223

(22) PCT Filed: Jul. 22, 2019

(86) PCT No.: PCT/US2019/042854
§ 371 (c)(1),
(2) Date: Feb. 22, 2021

(87) PCT Pub. No.: WO2020/050917
PCT Pub. Date: Mar. 12, 2020

(65) Prior Publication Data
US 2021/0305956 A1 Sep. 30, 2021

Related U.S. Application Data

(60) Provisional application No. 62/727,360, filed on Sep. 5, 2018.

(51) Int. Cl.
*H03F 3/45* (2006.01)
*H03F 3/26* (2006.01)
*H04L 25/49* (2006.01)

(52) U.S. Cl.
CPC ........... *H03F 3/45183* (2013.01); *H03F 3/26* (2013.01); *H03F 3/45475* (2013.01); *H04L 25/4917* (2013.01)

(58) Field of Classification Search
CPC .... H03F 3/45183; H03F 3/26; H03F 3/45475; H03F 3/2173; H03F 3/45179;
(Continued)

(56) References Cited

U.S. PATENT DOCUMENTS 5,894,237 A  4/1999  Brannon et al.
5,939,931 A  8/1999  Noro
(Continued)

FOREIGN PATENT DOCUMENTS

EP  2111709 A2  10/2009
WO  2020/050917 A1  3/2020

OTHER PUBLICATIONS

Notification of Transmittal of the International Search Report and the Written Opinion of the International Searching Authority, or the Declaration dated Oct. 18, 2019 re: Int'l Appln. No. PCT/US2019/042854. 10 Pages.

*Primary Examiner* — Khanh V Nguyen
(74) *Attorney, Agent, or Firm* — Mark H. Whittenberger, Esq.; Holland & Knight LLP (57) ABSTRACT

A current-mode transmitter amplifies a differential input signal to a differential, current-mode output signal. A split-input, current-mode-logic stage produces small, analog signals to limit switching currents and thus power consumption and power-supply noise. These small, analog signals are driven through a source-follower stage to reduce loading and shift the common-mode voltage to a desired level. A switched-current-source H-bridge driver combines differential outputs from the source-follower stage to provide an amplified differential output current. The output swing from the H-bridge driver is controlled by the voltage level from the source follower and derived from a replica-bias structure.

26 Claims, 6 Drawing Sheets

(58) Field of Classification Search
CPC .. H03F 3/45192; H03F 3/45089; H03F 3/217; H03F 3/2171; H04L 25/4917; H04L 25/085; H03M 1/74
USPC .............................................. 330/9, 251, 253
See application file for complete search history.

(56) References Cited

U.S. PATENT DOCUMENTS

| | | | |
|---|---|---|---|
| 6,005,439 | A | 12/1999 | Fong |
| 6,204,729 | B1 | 3/2001 | Takita |
| 6,246,598 | B1 | 6/2001 | Tarter et al. |
| 6,792,105 | B1 | 9/2004 | Moyer |
| 6,856,178 | B1 | 2/2005 | Narayan |
| 8,289,257 | B1 * | 10/2012 | Simon .................. G09G 3/3611 330/69 |
| 2007/0290726 | A1 * | 12/2007 | Kaiho .................. H03F 3/2173 327/108 |
| 2010/0066450 | A1 | 3/2010 | Palmer et al. |
| 2011/0227646 | A1 * | 9/2011 | Yamamoto .............. H03F 3/217 330/253 |

* cited by examiner

DIRECT-SWITCHING H-BRIDGE CURRENT-MODE DRIVERS

BACKGROUND

Binary communication systems represent information using just two symbols—e.g. relatively high and low currents or voltages—to alternatively represent a logical one and a logical zero (i.e. 1 or 0). The number of levels used to represent digital data is not limited to two, however. For example, a type of signaling referred to as PAM-4 (for pulse-amplitude modulation, 4-level) provides for four discrete pulse amplitudes to convey two binary bits of data per symbol (i.e., 00, 01, 10, and 11). A series of symbols can thus be communicated as a signal that transitions between levels in a manner that reflects the series. The time each level is held to represent a symbol is termed the "symbol time" and the speed with which symbols can be communicated is termed the "symbol rate."

Transmitters, or "drivers," convey signals using combinations of voltage and current levels, typically emphasizing one over the other. Voltage-mode drivers introduce undesirable power-supply noise and have output swing (voltage amplitude) limitations that limit switching speeds and therefore symbol rates. Current-mode drivers address some of these issues but suffer from headroom issues, especially at lower power-supply voltages, that make it difficult to distinguish between symbols.

BRIEF DESCRIPTION OF THE DRAWINGS

The detailed description is illustrated by way of example, and not by way of limitation, in the figures of the accompanying drawings and in which like reference numerals refer to similar elements and in which.

DETAILED DESCRIPTION

Figure 1:
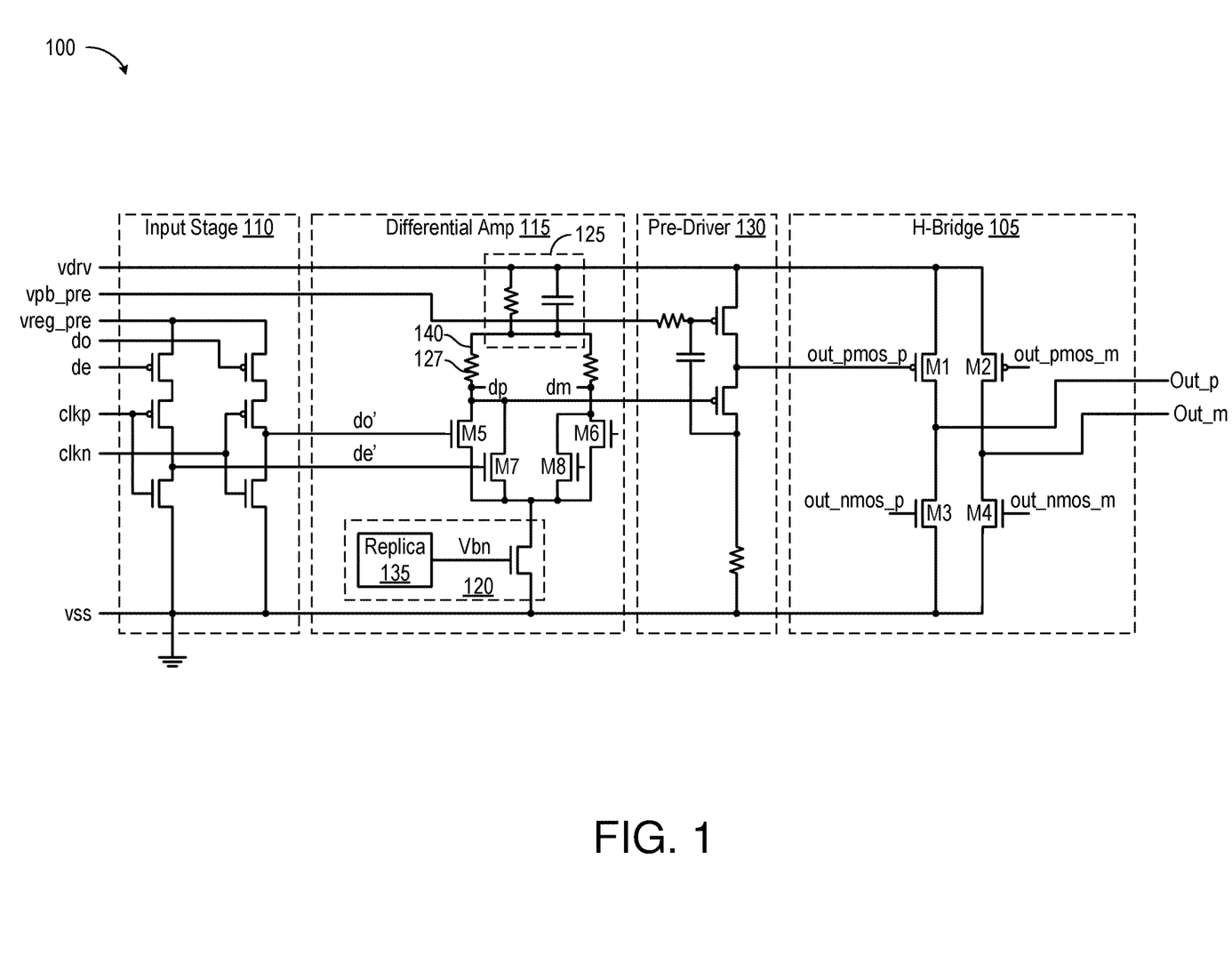
FIG. 1 depicts a serial-link transmitter 100 that amplifies a differential input signal presented as streams of alternating odd and even data symbols do and de to present a differential, current-mode output signal across output nodes Out_p/Out_m.

FIG. 1 depicts a serial-link transmitter 100 that amplifies a differential input signal presented as streams of alternating odd and even data symbols do and de to present a differential, current-mode output signal on complementary output nodes Out_p/Out_m. (As with other designations herein, these monikers refer both to signals and their corresponding ports, lines, or nodes; whether a given designation refers to a signal, node, or port will be clear from the context.) In comparison with a voltage-mode transmitter, current-mode transmitter 100 achieves a higher output voltage swing with reduced power-supply noise. These advantages are of particular importance for multi-PAM systems in which transmitted symbols are divided into more than two regions. Transmitter 100 achieves these advantages using an H-bridge current driver 105 that drives output signal Out_p/Out_m using less current, and thus less power, than a traditional current-mode logic (CML) transmitter to achieve the desired signal amplitude.

H-bridge 105 steers current across output nodes Out_p/Out_m responsive to voltage levels on the current-control terminals (e.g. gates) of four transistors M1, M2, M3, and M4. The first and second transistors M1 and M2 are P-type devices (PMOS transistors) with a first current-handling terminal (the source) connected to a 1.2V supply terminal vdrv and a second current-handling terminal (the drain) connected to respective and complementary output nodes Out_p/Out_m. The third and fourth transistors M3 and M4 are N-type devices (NMOS transistors) with a first current-handling terminal (the source) connected to a 0.0V supply terminal vss and a second current-handling terminal (the drain) connected to respective output nodes Out_p/Out_m. The circuitry used to derive each of the four inputs to H-bridge 105 is similar. FIG. 1 details the development of signal out_pmos_p alone for ease of illustration. Subsequent embodiments are shown in more detail.

Transmitter 100 includes a digital input stage 110 powered between supply voltages vreg_pre and vss. Stage 110 provides alternating streams of odd and even data symbols do and de—and their complements (not shown)—timed to respective complementary clock signals clkn/clkp to a small-signal differential amplifier 115 as digital data signals do' and de'. Amplifier 115 is a split-input current-mode logic (CML) stage with two differential transistor pairs M5/M6 and M7/M8 connected in parallel between a current source 120 and a load 125, one pair for each signal multiplexed in from input stage 110. Amplifier 115 combines binary alternating data signals do' and de' into an analog data signal dp input to a peaking analog pre-driver 130 with bias voltage vpb_pre, which amplifies signal dp to provide signal out_pmos_p to the gate of transistor M1 in H bridge 105. The other differential output from amplifier 115 (signal dm at the drains of transistors M6 and M8) feeds an identical pre-driver circuit (not shown) that supplies output signal out_pmos_m to the gate of transistor M2. The pull-down NMOS transistors M3 and M4 of H-bridge 105 are controlled by a separate combination of input stage, differential amplifier, and pre-driver that mirrors what is illustrated here. Exemplary circuitry for driving pull-down NMOS transistors M3 and M4 is detailed below in connection with FIG. 4.

Signals dp and out_pmos_p are small-signal analog, which allows amplifier 115 and pre-driver 130 to operate in a linear range while switching a relatively low level of current, thus reducing supply noise and jitter. In an embodiment in which driver supply voltage vdrv is 1.2V relative to supply voltage vss, for example, signal dp transitions between about 0.6V and 0.9V and signal out_pmos_p between about 0.9V and 1.2V. Pre-driver 130, a source-follower stage, allows for smaller, more efficient components in amplifier stage 115 but can be omitted in other embodiments.

All four transistors in H-bridge 105 operate as switched current sources. The higher voltage applied to terminal out_pmos_p, for example, turns off PMOS transistor M1. The lower voltage applied to terminal out_pmos_p is calibrated to set the current to node Out_p through transistor M1 to 12 mA. The remaining transistors M2, M3, and M4 are similarly controlled to either be in an off state or pass the same 12 mA current in an on state. Assuming fifty-ohm near and far termination, the output voltage at node Out_p thus transitions between 0.3V and 0.9V. Complementary output node Out_m likewise transitions between 0.3V and 0.9V so that transmitter 100 provides a 1.2V differential amplitude with a 0.6V common-mode voltage.

H-bridge 105 switches 12 mA currents between supply terminals vdrv and vss without series devices to maintain a higher swing voltage than a voltage-mode driver at a lower current than current-mode logic. The transistors of H-bridge 105 maintain a relatively constant current and so can be connected directly to the supply terminals rather than through an intervening component or components (e.g. via one or more a current sources). Direct supply connections improve headroom, which is especially important for multi-PAM signaling. Also advantageous, using the drive transistors to establish the output swing and drive current supports the use of an analog pre-driver for signal conditioning. In the instant example, analog pre-driver 130 provides peaking that expedites switching of H-bridge 105 to enhance edges of the output signal.

Differential amplifier 115 includes two differential pairs M5/M6 and M7/M8, a current source 120, and a load 125. Focusing on symbols do', transistor M5 draws a current calibrated at current source 120 through load 125 and a resistor 127 to develop the control voltage applied to the gate of PMOS transistor M1, and thus controls the pull-up current for output node Out_p. Transistor M6 operates similarly to transistor M5 responsive to the complement of symbols do' (not shown) to develop the control voltages for PMOS transistor M2. More complete signal paths through exemplary amplifiers are detailed in subsequent figures.

Current source 120 includes replica bias circuitry 135 that sets the current through load 125 to calibrate a secondary power-supply terminal 140 to the voltage level that results in the desired H-bridge PMOS bias level. Bias circuitry 135 can include scaled-down replicas of amplifier 115 and pre-driver 130 to derive a bias voltage vbn that inspires the requisite output current.

Figure 2:
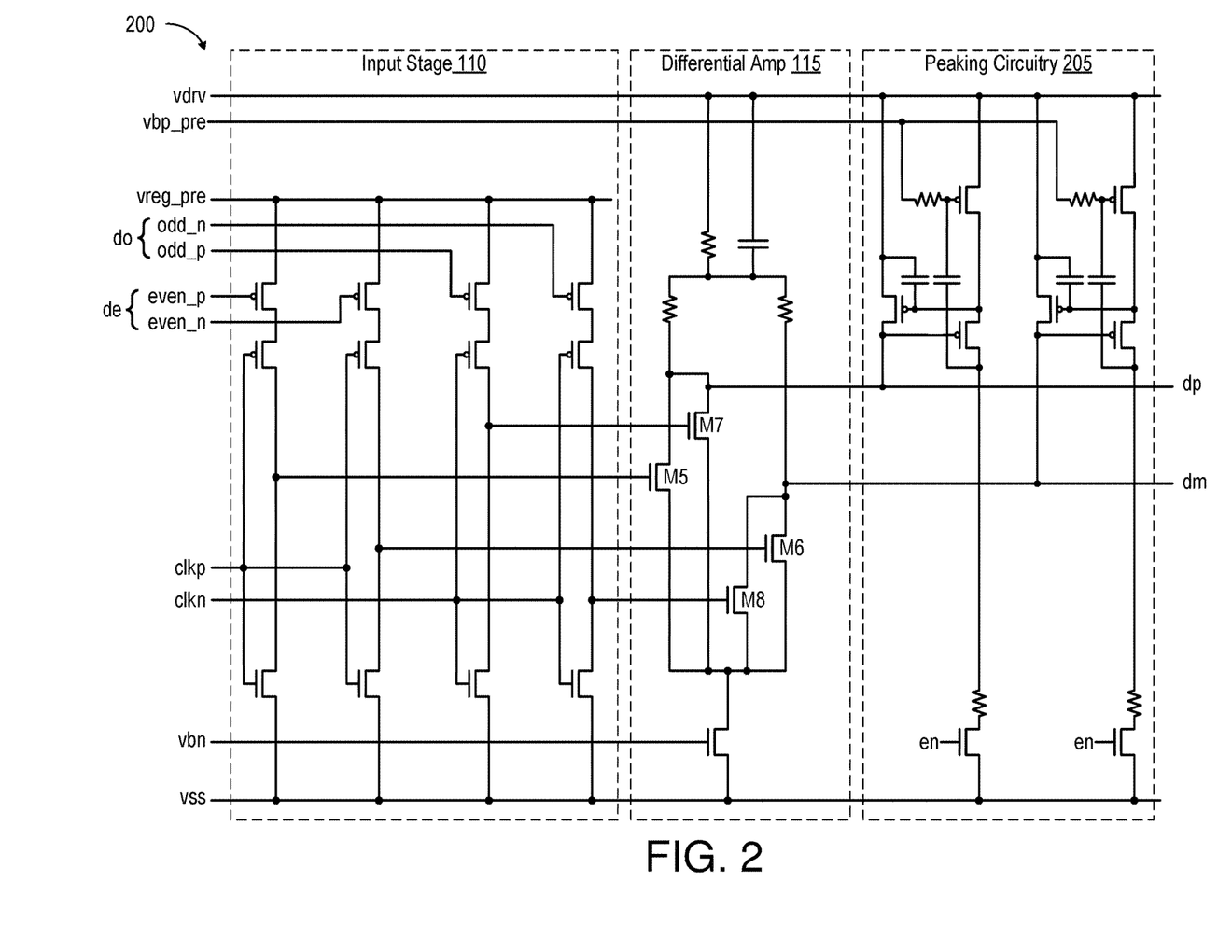
FIG. 2 schematically depicts multiplexing circuitry 200 with peaking circuitry 205.

FIG. 2 schematically depicts multiplexing circuitry 200 similar to what is illustrated in FIG. 1, with like-identified elements being the same or similar but including peaking circuitry 205 for further enhancing complementary signals dp/dm from differential amplifier 115. Circuitry 200 includes a detailed account of input stage 110, amplifier 115, and peaking circuitry 205. Peaking circuitry 205 operates at bias voltage vbp_pre and can be enabled or disabled responsive to an enable signal en.

Binary input signal do (de) of FIG. 1 is shown as differential signal odd_p/odd_n (even_p/even_n). Input stage 110 and differential amplifier 115 work together as a multiplexer that selects alternating data symbols responsive to respective complementary clock signals clkp/clkn and provides a corresponding sequence of differential, analog symbols across nodes dp and dm. Peaking circuitry 205, when enabled by assertion of enable signal en, enhances the leading edges of signal dp/dm.

Figure 3:
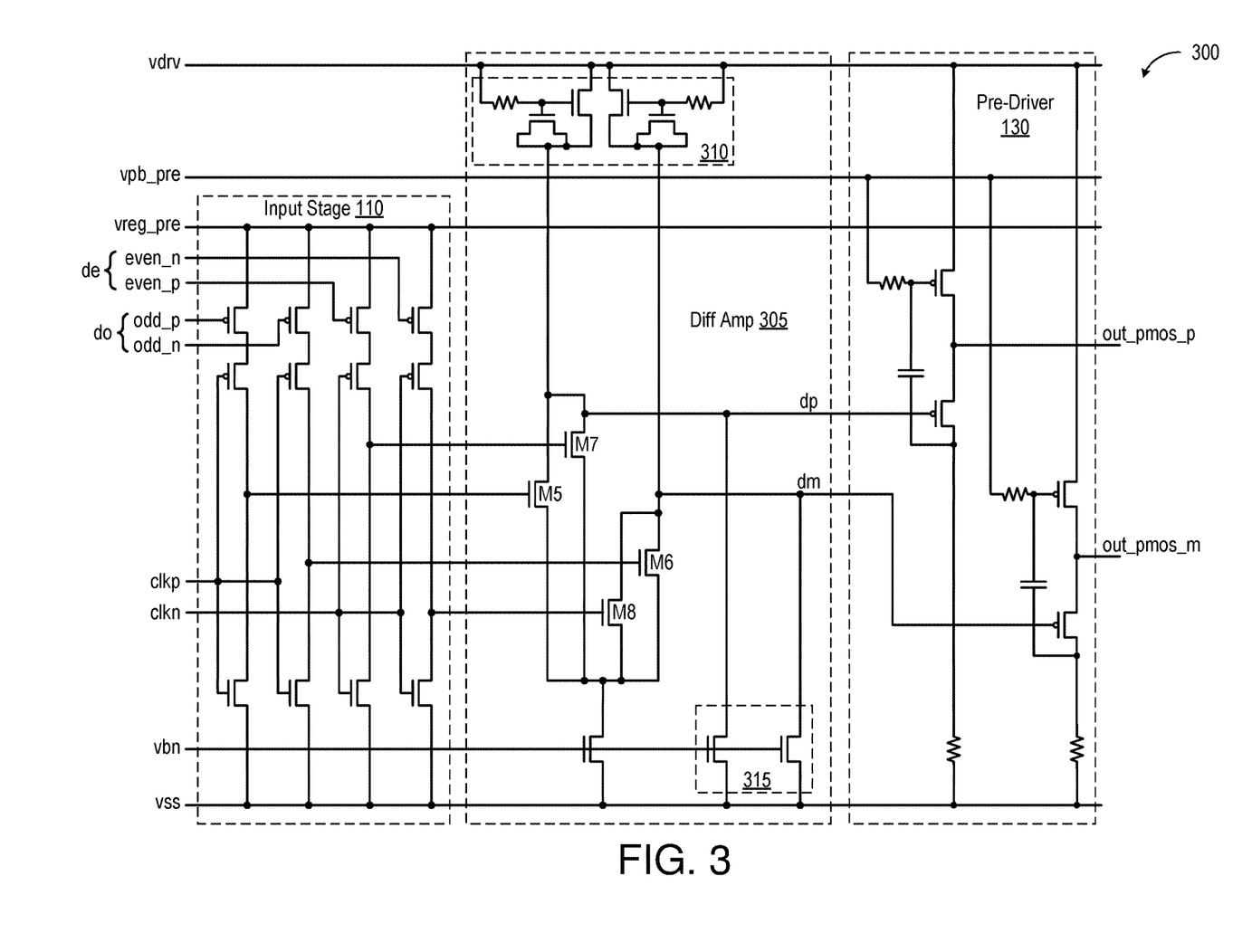
FIG. 3 schematically depicts pre-amplification circuitry 300 that drives the gates of the PMOS pull-up transistors of H-bridge 105 of FIG. 1 in accordance with one embodiment.

FIG. 3 schematically depicts pre-amplification circuitry 300 that drives the gates of PMOS pull-up transistors M1 and M2 of H-bridge 105 of FIG. 1 in accordance with another embodiment. Input stage 110 is as noted previously. A peaking pre-driver is omitted, however, in favor of a differential amplifier 305 with active loads 310 that produce a peaking response from differential transistor pairs M5/M6 and M7/M8. Current source 315 draws low levels of current that prevent transistors within active loads 310 from switching off entirely, and thus improves switching speeds. The circuitry for pre-driver 130 is shown for both complementary output signals out_pmos_p/out_pmos_m.

Figure 4:
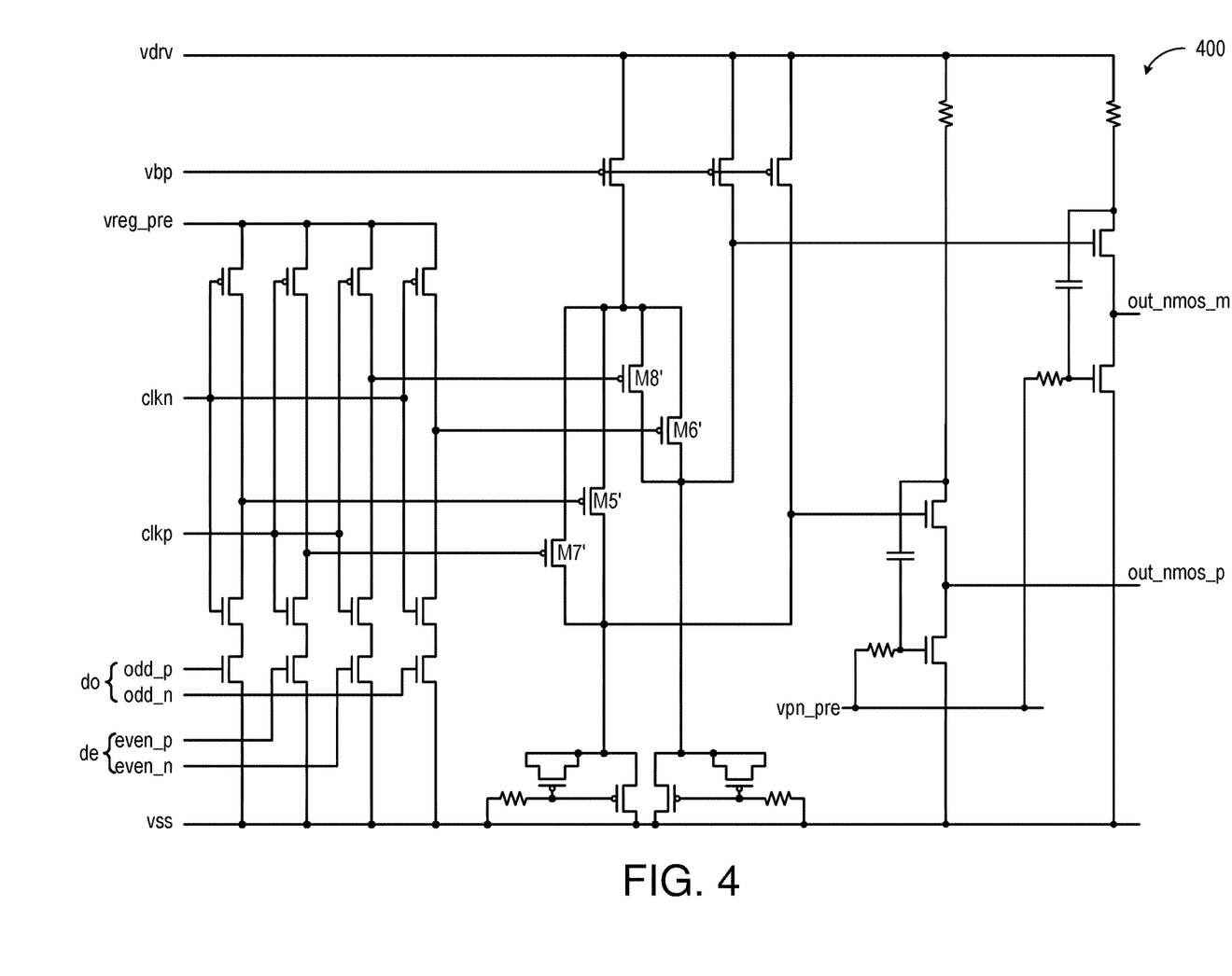
FIG. 4 schematically depicts pre-amplification circuitry 400 that drives the gates of the NMOS pull-down transistors of H-bridge 105 of FIG. 1 in accordance with an embodiment that mirrors circuitry 300 of FIG. 3.

FIG. 4 schematically depicts pre-amplification circuitry 400 that drives the gates of NMOS pull-down transistors M3 and M4 of H-bridge 105 of FIG. 1 in accordance with an embodiment that mirrors circuitry 300 of FIG. 3. Differential signal out_nmos_m/out_nmos_p transitions between about zero volts—to turn NMOS transistors M3 and M4 off—and about 0.3V to bias NMOS transistors M3 and M4 on such that they pass a 6 mA current. Bias circuitry (not shown) derives a bias voltage vbp that inspires the requisite output current by setting the pull-down current-source voltages for signal halves out_nmos_m/out_nmos_p. The same or different bias circuitry can establish the operating point of differential NMOS pre-drivers by setting a bias voltage vpn_pre.

Figure 5:
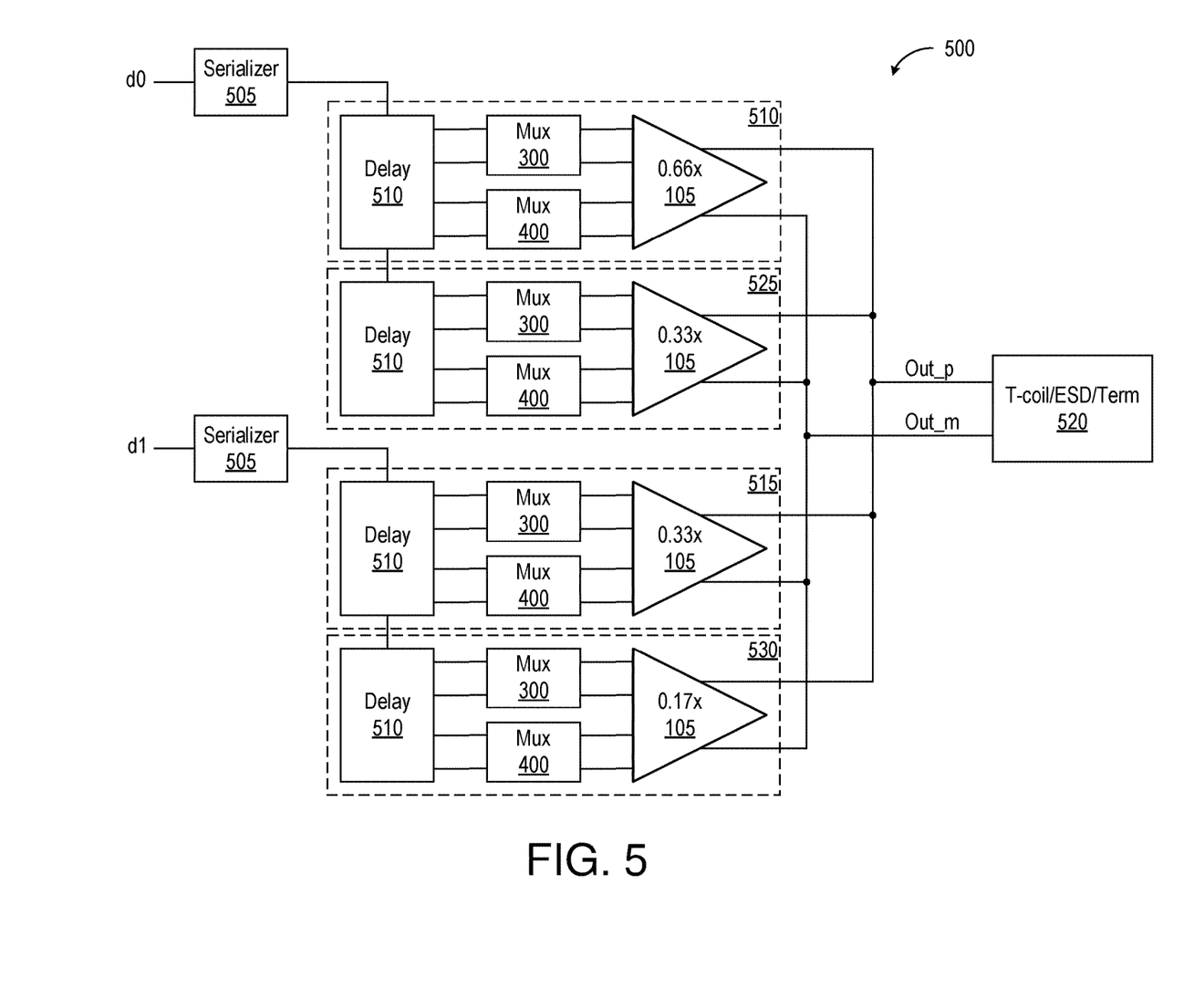
FIG. 5 depicts a two-tap PAM4 serial-link transmitter 500 in accordance with one embodiment.

FIG. 5 depicts a two-tap PAM4 serial-link transmitter 500 in accordance with one embodiment. High performance communication channels suffer from many effects that degrade symbols and consequently render them difficult to resolve. Primary among them are frequency dependent channel loss (dispersion) and reflections from impedance discontinuities. These effects cause neighboring symbols to interfere with one another and are commonly referred to collectively as Inter-Symbol Interference (ISI). For example, neighboring relatively high-voltage symbols may spread out to raise the level of neighboring lower-voltage symbols; if the resulting voltage distortion is sufficiently high, the lower-voltage symbols may be interpreted incorrectly. Lower-voltage symbols may likewise induce errors in neighboring higher-voltage symbols.

ISI becomes more pronounced at higher signaling rates, ultimately degrading signal quality such that distinctions between symbols may be lost. Transmitter 500 corrects for ISI imposed on a current symbol by a prior symbol by multiplying the value of the prior symbol by a "tap value" selected to account for the ISI and adding the resultant product to the level used to express the current symbol. ISI from a prior symbol that tends to lower (raise) the level of the current symbol is thus offset by a similar rise (fall) in the driving signal.

A pair of serializers 505 serialize respective binary bitstreams D0 and D1 and present the resulting data to respective serial-link transmitter 510 and 515 that amplify the data signals in the manner detailed previously to present corresponding differential signals on output nodes Out_p/Out_m. Transmitters 510 and 515 are schematically identical but sized differently so that transmitter 510 drives twice the current of transmitter 515. The combined current between output nodes Out_p/Out_m therefore expresses four levels. That is, for a drive current x, transmitters 510 and 515 collectively provide a combined drive current of ±0.66x±0.33x across output nodes Out_p/Out_m and through a load 520. Load 520 is labeled "T-coil/ESD/Term" to connote its inclusion of a T-coil to offset parasitic capacitance, electrostatic-discharge protection (ESD) circuitry, and a termination impedance. These structures are well known to those of skill in the art, so a detailed discussion is omitted. Transmitter 500 includes two additional, scaled-down transmitters 525 and 530 that amplify a prior symbol to counteract ISI. Additional transmitters can be included in support of additional taps to offset ISI from earlier or later symbols.

Figure 6:
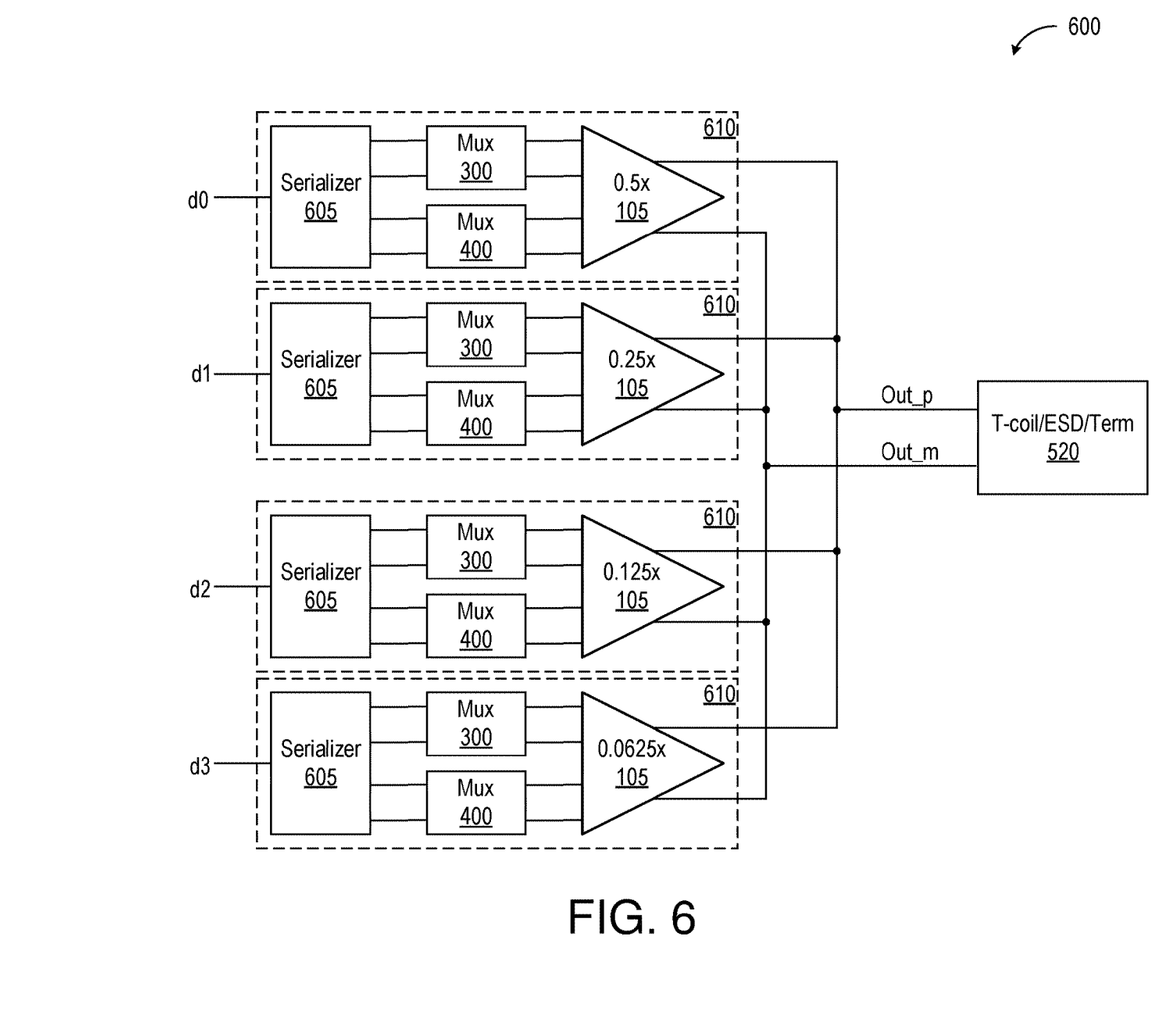
FIG. 6 depicts a four-bit, digital-to-analog converter (DAC), serial-link transmitter 600 in accordance with one embodiment.

FIG. 6 depicts a four-bit, digital-to-analog converter (DAC), serial-link transmitter 600 in accordance with one embodiment. Four serializers 605 serialize four respective binary bitstream d0, d1, d2, and d3 and present the resulting data symbols to respective multiplexer pairs for amplification by H bridges 105 of the type detailed in connection with FIG. 1. Transmitters 610 are schematically identical but sized differently so that their output currents, connected in parallel across the same load 520, collectively provide sixteen discernable current levels through a load 520. That is, for a drive current x, transmitters 610 collectively provide a combined drive current of ±0.5x±0.25x±0.125x±0.0625x across output nodes Out_p/Out_m and through load 520. Other levels and relative proportions may of course be used. Additional bits and serializers can be added to achieve more output levels.

In the foregoing description and in the accompanying drawings, specific terminology and drawing symbols have been set forth to provide a thorough understanding. In some instances, the terminology and symbols may imply specific details that are not required. The term "coupled" is used herein to express a direct connection as well as a connection through one or more intervening circuits or structures.

While the subject matter has been described in connection with specific embodiments, other embodiments are also envisioned. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A transmitter to transmit a differential output signal across complementary first and second output nodes, the transmitter comprising:
   a first switched current source having a first control terminal and a first output terminal coupled to the first output node, the first switched current source to selectively draw a constant pull-up current from the first output node;
   a second switched current source having a second control terminal and a second output terminal coupled to the first output node, the second switched current source to selectively draw a constant pull-down current from the first output node;
   a third switched current source having a third control terminal and a third output terminal coupled to the second output node, the third switched current source to selectively draw the constant pull-up current from the second output node;
   a fourth switched current source having a fourth control terminal and a fourth output terminal coupled to the second output node, the fourth switched current source to selectively draw the constant pull-down current from the second output node; and
   a serializer to serialize a data signal for transmission as the differential output signal.

2. The transmitter of claim 1, further comprising a pre-driver coupled to the first, second, third, and fourth control terminals, the pre-driver to selectively present first control signals to the first and third control terminals that result in the constant pull-up current and to selectively present second control signals to the second and fourth control terminals that result in the constant pull-down current.

3. The transmitter of claim 2, further comprising a current-mode logic stage coupled to an input of the pre-driver.

4. The transmitter of claim 3, further comprising a digital input stage coupled to an input of the current-mode logic.

5. The transmitter of claim 1, wherein:
   the first switched current source has a first direct connection to a first supply node; the
   second switched current source has a second direct connection to a second supply node;
   the third switched current source has a third direct connection to the first supply node; and
   the fourth switched current source has a fourth direct connection to the second supply.

6. The transmitter of claim 5, wherein the first control terminal is a gate of a transistor, the first output terminal is a drain of the transistor, and the first direct connection is between a source of the transistor and the first supply node.

7. A transmitter for amplifying a differential input signal to a differential output signal across a first output node and a second output node, the transmitter comprising:
   an H-bridge current driver connected between a first supply terminal and a second supply terminal, the H-bridge current driver having:
   a first transistor having a first current-handling terminal connected to the first supply terminal, a control terminal, and a second current-handling terminal connected to the first output node;
   a second transistor having a first current-handling terminal connected to the first supply terminal, a control terminal, and a second current-handling terminal connected to the second output node;
   a third transistor having a first current-handling terminal connected to the second supply terminal, a control terminal, and a second current-handling terminal connected to the first output node;
   a fourth transistor having a first current-handling terminal connected to the second supply terminal, a control terminal, and a second current-handling terminal connected to the second output node;
   a differential amplifier having:
   a differential-amplifier load; a current source;
   a fifth transistor having a first current-handling terminal coupled the differential amplifier load and the control terminal of the first transistor, a differential amplifier control terminal to receive a first half of the differential input signal, and a second current-handling terminal coupled to the current source;
   a sixth transistor having a first current-handling terminal coupled to the differential-amplifier load and the control terminal of the second transistor, a differential amplifier control terminal to receive a second half of the differential input signal, and a second current-handling terminal coupled to the current source;
   a seventh transistor having a first current-handling terminal coupled the differential amplifier load and the control terminal of the first transistor, a differential amplifier control terminal to receive a first half of a second differential input signal, and a second current-handling terminal coupled to the current source; and
   an eighth transistor having a first current-handling terminal coupled to the differential amplifier load and the control terminal of the second transistor, a differential amplifier control terminal to receive a second half of the second differential input signal, and a second current handling terminal coupled to the current source.

8. The transmitter of claim 7, the differential amplifier further having:
   a second differential amplifier load;
   a second current source;
   a seventh transistor having a first current-handling terminal coupled the second differential amplifier load and the control terminal of the third transistor, a differential amplifier control terminal, and a second current-handling terminal coupled to the second current source; and an eighth transistor having a first current-handling terminal coupled to the second differential amplifier load and the control terminal of the fourth transistor, a differential amplifier control terminal, and a second current-handling terminal coupled to the second current source.

9. The transmitter of claim 8, the differential amplifier further having bias circuitry to set switching voltages on the first current-handling terminal of the fifth transistor and the first current-handling terminal of the sixth transistor.

10. The transmitter of claim 9, the bias circuitry including a replica of the fifth transistor and the sixth transistor.

11. The transmitter of claim 8, the control terminal of the seventh transistor to receive the first half of the differential input signal and the control terminal of the eighth transistor to receive the second half of the differential input signal.

12. The transmitter of claim 7, further comprising a first peaking pre-driver and a second peaking pre-driver, wherein the first current-handing terminal of the fifth transistor is coupled to the control terminal of the first transistor via the first peaking pre-driver and the first current-handling terminal of the sixth transistor is coupled to the control terminal of the second transistor via the second peaking pre-driver.

13. The transmitter of claim 7, wherein the first transistor and the second transistor are P-type devices, and the third transistor and the fourth transistor are N-type devices.

14. The transmitter of claim 7, wherein the differential output signal exhibits a voltage amplitude equal to a voltage difference between the first supply terminal and the second supply terminal.

15. The transmitter of claim 7, wherein each of the first, second, third, and fourth transistors switches between an off state and a current-source state responsive to the differential input signal.

16. The transmitter of claim 7, further comprising:
a second H-bridge current driver connected between the first supply terminal and the second supply terminal, the second H-bridge current driver scaled to drive a second differential output signal less than the first differential output signal across the first output node and the second output node.

17. The transmitter of claim 16, further comprising:
a second differential amplifier to amplify the first half and the second half of the differential input signal and pass the amplified first half and the amplified second half of the differential input signal to the second H-bridge current driver.

18. The transmitter of claim 17, wherein the differential input signal expresses symbols over symbol times and the second differential amplifier amplifies the differential input signal at a later symbol time than the first-mentioned differential amplifier.

19. The transmitter of claim 7 further comprising an input stage to derive the first-mentioned differential input signal from a first data signal and the second differential input signal from a second data signal.

20. A transmitter for amplifying a differential input signal to a differential output signal across a first output node and a second output node, the transmitter comprising:
a first differential amplifier to amplify each of a first half of the differential input signal and a second half of the differential input signal between a high off level and a pull-up current-source level;

a second differential amplifier to amplify each of the first half of the differential input signal and the second half of the differential input signal between a low off level and a pull-down current-source level; and an H-bridge current driver connected between a first supply terminal and a second supply terminal, the H-bridge current driver having:
first and second pull-up transistors having control terminals coupled to the first differential amplifier to receive the high off level and the pull-up current-source level;
first and second pull-down transistors having control terminals coupled to the second differential amplifier to receive the low off level and the pull-down current-source level;
wherein the first output node is connected between the first pull-up transistor and the first pull-down transistor, the second output node is connected between the second pull-up transistor and the second pull-down transistor, and the H-bridge current driver drives the differential output signal between the first output node and the second output node; and a pre-driver disposed between the first differential amplifier and the pull-up transistors.

21. The transmitter of claim 20, further comprising a second pre-driver disposed between the second differential amplifier and the pull-down transistors.

22. The transmitter of claim 20, wherein the pre-driver is a peaking pre-driver.

23. A transmitter for amplifying an input signal to an output signal on an output node, the transmitter comprising:
a first amplifier to amplify the input signal to between a high off level and a pull-up current-source level;
a second amplifier to amplify the input signal to between a low off level and a pull-down current-source level; and
a current driver connected between a first supply terminal and a second supply terminal, the current driver having:
a pull-up transistor having a control terminal coupled to the first amplifier to receive the high off level and the pull-up current-source level, a first current-handing terminal connected to the first supply terminal, and a second current-handling terminal connected to the output node, the pull-up transistor operating as a first switched current source responsive to the high off level and the pull-up current-source level; and
a pull-down transistor having a control terminal coupled to the second amplifier to receive the low off level and the pull-down current-source level, a first current-handing terminal connected to the second supply terminal, and a second current-handling terminal connected to the output node, the pull-down transistor operating as a second switched current source responsive to the low off level and the pull-down current-source level.

24. The transmitter of claim 23, further comprising a first pre-driver disposed between the first amplifier and the pull-up transistor and a second pre-driver disposed between the second amplifier and the pull-down transistor.

25. The transmitter of claim 24, wherein the first pre-driver and the second pre-driver are peaking pre-drivers.

26. The transmitter of claim 23, wherein the first amplifier includes a scaled replica of the first amplifier, the scaled replica to set the pull-up current-source level.

* * * * *